United States Patent [19]

Shirahama

[11] 4,423,395

[45] Dec. 27, 1983

[54] SURFACE ACOUSTIC WAVE FILTER

[75] Inventor: Kengoro Shirahama, Toda, Japan

[73] Assignee: Clarion Co., Ltd., Tokyo, Japan

[21] Appl. No.: 290,383

[22] Filed: Aug. 5, 1981

[30] Foreign Application Priority Data

Aug. 7, 1980 [JP] Japan .................. 55-107675

[51] Int. Cl.³ .................. H03H 9/64; H03H 9/05; H03H 9/10
[52] U.S. Cl. .................. 333/193; 333/194
[58] Field of Search .................. 333/150–155, 333/193–196, 12; 310/313 A, 313 B, 313 C, 313 D, 313 R; 29/25.35; 174/32, 52 R, 17 R; 334/85

[56] References Cited

U.S. PATENT DOCUMENTS 238,195  2/1881  Brooks .................. 174/32
2,878,378  3/1959  Carlson .................. 334/85
2,904,618  9/1959  Robinson et al. .................. 174/52 PE
3,983,424  9/1976  Parks .................. 333/155

OTHER PUBLICATIONS

Forrest–"A Tvi Filter for Coaxial Transmission Lines", Radio and Television News, Mar. 1950; pp. 61–62.

Primary Examiner—Marvin L. Nussbaum
Attorney, Agent, or Firm—Russell E. Hattis; Stephen R. Arnold

[57] ABSTRACT

A surface acoustic wave filter in which a surface acoustic wave element is secured on a metallic board integrally formed with coaxial type connectors and the coaxial type connectors and electrodes provided on the surface acoustic wave elements are directly connected by bonding wires.

3 Claims, 5 Drawing Figures

SURFACE ACOUSTIC WAVE FILTER

BACKGROUND OF THE INVENTION

1. Field of the Invention

This invention relates to a mounting structure of a surface acoustic wave filter adapted for use in a high frequency range.

2. Description of the Prior Art

A surface acoustic wave filter is making use of opposite piezoelectric effect that when electric field is applied to a resonator made of a piezoelectric material, the resonator is deformed to generate a distortion or stress. The surface acoustic wave filter abbreviated as a SAW filter has recently and widely been used in RF stage amplifiers and intermediate frequency amplifiers of TV receivers as well as in intermediate frequency amplifiers of FM Radio Receivers.

FIG. 1 shows a principle diagram of a such a SAW filter in which the reference numeral 1 denotes a SAW element. The reference numerals 2 and 3 as well as 4 and 5 designate opposed two pairs of electrodes of which the pair of electrodes 2 and 3, for example, are used as input electrodes while the other pair of electrodes 4 and 5 are used as output electrodes with surface acoustic wave being propagated as shown by arrows 6 from the input electrodes 2, 3 to the output electrodes 4, 5.

There electrodes are connected to outer circuits through two pairs of outgoing lines (not shown) connected to the electrodes 2, 3 and 4, 5 in parallel and four terminal pins.

However, in such a SAW filter, S-parameter of the SAW element itself largely varies in accordance with connecting condition between the outgoing lines (including bonding wires and terminal pins) and the outer circuits in a high frequency range higher than about 300 MHz. Particularly, the outgoing lines come to represent an intensive inductivity which causes radiation loss therefrom resulting in various operational troubles.

OBJECT OF THE INVENTION

It is therefore an object of the present invention to provide a surface acoustic wave filter having a mounting structure so as to eliminate the above conventional drawbacks by securing a SAW element on a metallic board integrally formed with coaxial type connectors and connecting the coaxial connectors and the SAW element by bonding wires.

SUMMARY OF THE INVENTION

In accordance with the present invention, there is provided a surface acoustic wave filter comprising:
a surface acoustic wave element;
input electrodes and output electrodes provided on said surface acoustic wave element;
a metallic board on which said surface acoustic wave element is mounted; and
coaxial type connectors provided on said metallic board and connected to said electrodes.

DETAILED DESCRIPTION OF THE PREFERRED EMBODIMENTS

The present invention will now be described in detail referring to the preferred embodiments illustrated in the accompanying drawings.

Figure 1:
FIG. 1 shows a principle diagram illustrating a conventional structure.
Figure 2:
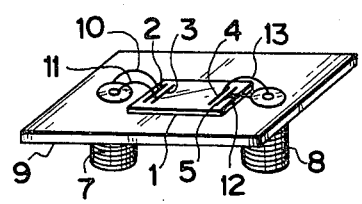
FIGS. 2-5 show perspective views of the preferred embodiments according to the present invention.

FIG. 2 shows a perspective view of an embodiment according to the present invention in which the reference numeral 1 denotes a SAW element. Further, the numerals 2-5 are electrodes, 7 and 8 are coaxial connectors and 9 is a metallic board integrally formed with the connectors 7 and 8. The numerals 10-13 denote bonding wires connecting the electrodes 2-5 of the SAW element 1 and the coaxial connectors 7 and 8.

After the SAW element 1 is secured on the metallic board 9, the bonding wires 10-13 are coupled to the SAW element 1. The coaxial connectors 7 and 8 are preferable to be of a small type such as SMA type connector, for example, having a characteristic impedance of 50 Q or 75 Q.

Figure 3:
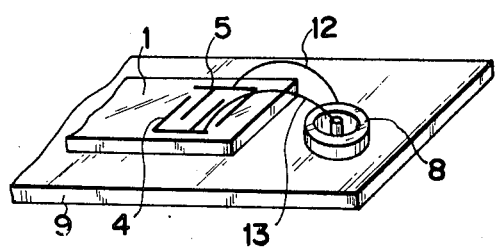

FIG. 3 shows a partially enlarged view of FIG. 2 in which the bonding wires 10-13 are connected to the electrodes 2-5 on one hand and on the other hand to the core portion and the grounded line portion of the coaxial connectors 7 and 8. In this case, the SAW element 1 and the coaxial connectors 7 and 8 are formed to have the same height above the metallic board 9 in order to let the bonding be achieved easily.

The reason why the coaxial connectors of 50 Q or 75 Q are recommended instead of conventional outgoing lines is that the structure can then be widely used. That is, most of S parameter measuring instruments on the market have the above characteristic impedances and therefore the SAW element provided with the above coaxial connectors can be easily coupled with those measuring instruments. To integrally form the metallic board 9 and the coaxial connectors 7 and 8 as shown in FIG. 2 makes it possible to mass produce them resulting in reduction of production cost. In case of independently distributing the SAW element 1 mounted on the metallic board 9 as semi-manufactured goods, it is preferable to provide the SMA type connectors which are generally used. However, if the SAW element 1 is mounted in a device of a producer itself, it is possible to form one of other coaxial connectors which can be produced at a lower cost thus allowing further reduction of production cost.

As shown in FIGS. 2 and 3, the electrodes 2-5 of the SAW element 1 and the coaxial connectors 7, 8 are connected to each other by means of the bonding wires 10-13. In this case, the bonding wires may be shorter than conventional outgoing lines. Further, by arranging each two bonding wires in substantially parallel, radiation loss therefrom can be effectively avoided.

Figure 4:
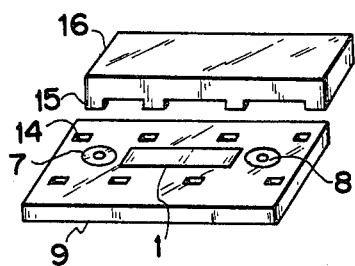
Figure 5:
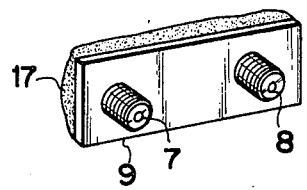

FIG. 4 illustrates another embodiment according to the present invention which enables further complete prevention of radiation loss. In the same figure, the metallic board 9 is provided with a plurality, i.e. eight, for example, of slits 14. On the other hand, a metallic cover 16 having edges 15 which are to be inserted into the slits 14. Thus, the SAW element 1 and the coaxial connectors 7, 8 are covered by the metallic cover 16 to be thereby completely sealed from outside. Further, by stiffening the entire portion of the metallic cover 16 by a plastic mold 17, further complete sealing can be achieved.

According to the filter of the present invention as described above, even in a high frequency range higher than 300 MHz, for example, it is possible to extremely reduce reflections which have been caused by conventional outgoing lines, to prevent radiation loss and thus to provide a SAW element having a mean S-parameter.

Particularly when a SAW element comes to have a characteristic better than a present one thus to be adopted in a high frequency stage of a telecommunicating device, the filter according to the present invention will surely be effective as being formed compact.

A SAW element presently adopted for military use (a convolver, a correlator and the like) is accomodated in a fairly heavy case formed by milling a lump of brass. Such structure is of too high qualification as a civilian use. However, in case of using the SAW element in such devices, three coaxial connectors are to be formed and it should be noted that when independently distributed as semi-manufactured goods, the SAW elements provided with three coaxial connectors are more convenient and have a merit as being constructed more durably. Therefore, when an SS telecommunication comes to be of civilian use in the future, the filter according to the present invention will surely be effective in its production cost and its handling.

As apparent from the above description, according to the present invention, there can be provided a surface acoustic wave filter capable of allowing a SAW element to represent an excellent characteristic particularly in a high frequency range.

I claim:
1. A surface acoustic wave filter comprising:
   a surface acoustic wave element having a first planar surface with input and output electrodes provided thereon;
   a metallic board on which said surface acoustic wave element is mounted;
   at least two coaxial-type connectors each having an associated shell and central electrode and configured with one end of each said shell and the end of its associated electrode lying in an end-defining plane, said connectors diposed to place their respective end-defining planes coplanarly with respect to said first planar surface;
   a first pair of wires connected between said input electrodes and said shell and central electrode respectively at said one end of one of said coaxial-type connectors, said first pair of wires being disposed in parallel; and
   a second pair of wires connected between said output electrodes and said shell and central electrode respectively at said one end of another of said coaxial-type connectors, said second pair of wires being disposed in parallel.
2. The filter as claimed in claim 1 further comprising a metallic cover wherein said metallic board is provided with a plurality of slits and said metallic cover is provided with edges corresponding to said slits, said edges being inserted into said slits.
3. The filter as claimed in claim 2, wherein the entire portion of said metallic cover on said metallic board is stiffened by a plastic mold.

* * * * *